United States Patent [19]
De Groot et al.

[11] Patent Number: 5,926,023
[45] Date of Patent: Jul. 20, 1999

[54] METHOD OF IMPROVING THE RESOLUTION IN TWO-DIMENSIONAL HETERONUCLEAR CORRELATION SPECTRA OF SOLID STATE NMR

[75] Inventors: Hubertus Johannes Maria De Groot, Leiden, Netherlands; Hans Förster, Woerth, Germany; Barth-Jan Van Rossum, Oegstergeest, Netherlands

[73] Assignees: Rijksuniversiteit Leiden, Leinden, Netherlands; Bruker Analytik GmbH, Rheinstetten, Germany

[21] Appl. No.: 08/970,808

[22] Filed: Nov. 14, 1997

[30]     Foreign Application Priority Data

Nov. 22, 1996 [DE] Germany ........................... 196 48 391

[51] Int. Cl.$^6$ ...................................................... G01V 3/00
[52] U.S. Cl. ........................................... 324/309; 324/300
[58] Field of Search ...................................... 324/309, 307, 324/310, 312, 314, 313, 300

[56]                References Cited

U.S. PATENT DOCUMENTS

| | | | |
|---|---|---|---|
| 5,260,656 | 11/1993 | Cory | 324/309 |
| 5,327,087 | 7/1994 | Hafner et al. | 324/309 |
| 5,327,088 | 7/1994 | Pipe | 324/309 |

FOREIGN PATENT DOCUMENTS 0481256   4/1992   European Pat. Off. .

OTHER PUBLICATIONS

Journal of Magnetic Resonance Series B 107, pp. 88–90 (1995).
A.Ramamoorthy et al.: "Three–Dimensional Solid–State NMR Experiment That Correlates the Chemical Shift and Dipolar . . . ".
Chemical Physics Letters, vol. 89, No. 5, pp. 363–367 (Jul. 1982) "Heteronuclear Solid–State Correlation Spectroscopy".
Chemical Physics Letters, vol.100, No. 4, pp. 305–310 (Sep. 1983) "Heteronuclear Correlation Spectroscopy in Rotating Solids".
Chemical Physics Letters, vol.155, No.4,5 pp. 341–346 (1989) "Frequency–Switched Pulse Sequences: Homonuclear Decoupling and Dilute Spin NMR in Solids".
Journal of Magnetic Resonance A 120, pp. 274–277 (1996) "High Magnetic Field for Enhanced Proton Resolution in High–Speed CP/MAS Heteronuclear 1H–13C Dipolar–Correlation Spectroscopy".
Journal of Magnetic Resonance A 121, pp. 114–120 (1996) "Plane Selection in Indirect MARF Solid–State Imaging".
Journal of Magnetic Resonance A 104, pp. 334–339 (1993) "Variable–Amplitude Cross–Polarization MAS NMR".
Journal of Chemical Physics 103 (1995), pp. 6951–6958 (1995) "Heteronuclear Decoupling in Rotating Solids".
Ray Freeman: A Handbook of Nuclear Magnetic Resonance, Longman Scientific & Technical (1990), pp. 137–141, and pp. 151–155.
Journal of Magnetic Resonance, vol. 95, pp. 184–190 (1991) "WIMSE, a New Spectral Editing Technique for CPMAS Solid–State NMR".
Biochemical and Biophysical Research Communications, vol. 113, No. 3 (1983), pp. 967–972 "Application Of Phase Sensitive Two–Dimesional Correlated Spectroscopy (COSY) For Measurements . . . ".

*Primary Examiner*—Louis Arana
*Attorney, Agent, or Firm*—Paul Vincent

[57]            ABSTRACT

The invention concerns a two-dimensional heteronuclear correlation spectroscopy method for the measurement of solid state NMR samples. The nuclear spins are decoupled in the evolution interval by means of a FSLG-RF pulse sequence irradiated in the proton frequency band. Since this sequence may be very short compared to the ones hitherto used, and it is not necessary to irradiate simultaneously radio frequency in the area of the S-nuclei, the method is suitable in particular for high rotational velocities of the sample and high magnetic fields, where it effects a considerable improvement of the resolution.

16 Claims, 3 Drawing Sheets

METHOD OF IMPROVING THE RESOLUTION IN TWO-DIMENSIONAL HETERONUCLEAR CORRELATION SPECTRA OF SOLID STATE NMR

This application claims Paris Convention priority of German patent application 196 48 391.3 filed Nov. 22, 1996, the complete disclosure of which is hereby incorporated by reference.

BACKGROUND OF THE INVENTION

The invention relates to a method of two-dimensional heteronuclear correlation spectroscopy for the investigation of solid state samples containing a first type of nucleus ($^1$H) and a second type of nucleus ($^{13}$C), in a nuclear magnetic resonance spectrometer by means of a pulse sequence of nuclear magnetic resonance which pulse sequence comprises a preparation interval, an evolution interval, a mixing interval and a detection interval, wherein during the preparation interval the first type of nucleus is excited by means of at least one preparation radio frequency pulse in a first frequency band, and is exposed to evolution radio frequency pulses in the first frequency band during the evolution interval, wherein during the mixing interval the first type of nucleus is irradiated with cross polarisation radio frequency pulses in the first frequency band for transfer of nuclear magnetization to the second type of nucleus, and the second type of nucleus is irradiated in a second frequency band with at least one excitation radio frequency pulse, and wherein during the detection interval the first type of nucleus is exposed to at least one decoupling radio frequency pulse in the first frequency band, whereas a free induction decay of the second type of nucleus is detected in the second frequency band and wherein the pulse sequence ($1 \leq p \leq n$) is carried out n times in succession with identical preparation interval, mixing interval and detection interval, however with altered evolution interval, and wherein the sample rotates at a rotational frequency of more than 1 kHz about an axis which is tilted by approximately 54° with respect to the axis of a homogeneous magnetic field.

A method of this type is known from EP-A 0 481 256 (U.S. Pat. No. 5,117,186).

Nuclear magnetic resonance (NMR) is a phenomenon which occurs in connection with a selected group of atomic nuclei and is based on the existence of nuclear magnetic moments in these atomic nuclei. If an atomic nucleus having a nuclear spin is introduced into a strong uniform and static magnetic field (a so-called "Zeeman field") and is excited by means of a weak radio frequency (RF) magnetic field, the nuclear spin precesses at a natural resonance frequency, the Larmor frequency, which is characteristic for each type of nucleus with a nuclear spin, and depends on the strength of the magnetic field prevailing at the location of the nucleus. Typical atomic nuclei with a magnetic moment are e.g. $^1$H, $^{13}$C, $^{19}$F and $^{31}$P. The resonance frequencies of the nuclei can be observed by observing the transverse magnetization which occurs after a strong RF pulse. It is common practice to convert the measured signal into a frequency spectrum by means of Fourier transformation.

Although identical nuclei have the same frequency dependence on the magnetic field, differences in the direct chemical environment of each nucleus can modify the magnetic field such that nuclei of the same sample do not experience the same effective magnetic field. The differences in the local magnetic field cause spectral shifts of the Larmor frequency between two nuclei of this type which are chemically not equivalent, which are called "chemical shifts". These chemical shifts are interesting since they provide information about the number and the position of the atoms in a molecule and about the relative arrangement of neighbouring molecules within a compound.

Unfortunately, it is not always possible to interpret the frequency spectra caused by the chemical shifts since there are still other interactions which might be dominant.

This applies in particular to NMR spectroscopy of solid samples. In NMR spectroscopy of fluids, the fast movement of the molecules has the tendency to isolate the nuclei and separate the nuclear interactions such that it is much easier to recognize different nuclei in the spectrum. In solid state NMR there are numerous interactions between the molecules which obscure the result. The magnetic moments e.g. of neighbouring nuclei disturb each other leading to interactions which are called "dipole-dipole couplings". These couplings widen the characteristic resonance lines and cover the "fine" resonance structure caused by the chemical shift. A further problem occurring in connection with solid samples and not with fluids consists in that the orientation of the molecules in solids in relation to the Zeeman field applied, is relatively fixed and, for that reason, the chemical shifts are anisotropic such that a contribution to the resonance frequency depends on the spatial orientation of the molecules relative to the magnetic field applied. Consequently, it is essential to suppress some of these interactions in order to achieve an informative result for the others. This is usually achieved by exciting the system at selected frequencies so that undesired interactions are removed or at least averaged to a reduced amplitude. In solids e.g. the above-mentioned anisotropy of the chemical shift is usually largely reduced by orienting the solid sample at the so-called "magic angle" (54°44') with respect to the magnetic field applied and rotating it at this angle at a relatively fast frequency, whereby the anisotropic field components are averaged to zero.

In a similar manner it is possible by means of known techniques to reduce the undesired spin-spin interactions by irradiating the nuclei with additional RF pulses at or near the Larmor frequencies. By carefully selecting different polarizations and phases of the RF pulses, the magnetization of the disturbing nuclear spin systems in neighbouring groups can be changed whereby the spin interactions are effectively averaged such that their contribution to the final measured value is reduced to a great extent. Since the Larmor frequency is different for each type of nucleus, an applied RF field will have a much greater effect on those spins comprising a Larmor frequency which is close to the applied frequency, than on spins of different Larmor frequency. In this manner, applied RF fields can be used in order to influence a type of nucleus while others remain unchanged.

Owing to the special problems of solid state spectroscopy, often a two-dimensional spectroscopic technique in the time domain is used in order to improve the resolution. By means of this technique, it becomes possible to investigate the interaction or "correlation" between two differing types of nuclei in a solid state—the interaction between protons and $^{13}$C nuclei is normally of great interest in many organic solids. The basic technique of the two-dimensional heteronuclear correlation in connection with solids is well known and described in many articles, as e.g. in "Heteronuclear Correlation Spectroscopy" by P. Caravatti, G. Bodenhausen and R. R. Ernst, Chemical Physics Letters Vol 89, No. 5, pp. 363–367 (July 1982) and in "Heteronuclear Correlation Spectroscopy in Rotating Solids" by P. Caravatti, L. Braunschweiler and R. R. Ernst, Chem. Phys. Letters, Vol. 100, No. 4, pp. 305–310 (September 1983). The contents of these articles are hereby incorporated by reference.

As it is described in the above-mentioned articles, the two-dimensional heteronuclear correlation technique comprises an "experiment" in the time domain which consists of four different subsequent time intervals. The first interval is called "preparation interval". During that time, one of the two examined types of nuclei is brought into an excited coherent unbalanced state which changes or "develops" during the following time intervals. The preparation interval may consist of irradiation of one single RF pulse or also of a sequence of RF pulses. The preparation interval has usually a fixed length of time.

The second time interval is called "evolution interval", during which the excited nuclear spins "develop" under the influence of the applied magnetic field, the neighbouring nuclear spins, possibly irradiating periodic RF pulse sequences and sample rotation. The evolution of the excited nuclei during this interval makes it possible to determine these frequencies. A number of "experiments" or "scans" is carried out, wherein the evolution time of the evolution interval is incremented systematically from scan to scan.

The evolution interval is followed by a "mixing interval". During the mixing interval one or more RF pulses can be applied which causes transfer of the coherence or polarization from the excited nucleus to the other investigated type of nucleus. The coherence or polarization transfer triggered by the mixing process is characteristic for the investigated nuclear system.

The mixing interval is finally followed by a "detection interval" in which the resonance frequencies of the second type of nucleus are measured. During this time interacting nuclei are usually irradiated by pulses or continuous RF energy in order to stop interaction between the two types of nuclei (decoupling).

After the Fourier transformation, the result of the multiple experiment is a two-dimensional spectral profile called heteronuclear correlation spectrum (also: 2D HETCOR PLOT). On the one axis of the plot, the detected frequencies of the second type of nucleus are displayed. The other axis represents the frequencies of the first type of nucleus detected via the repeated scans with incremented evolution times. Since the measured signal amplitude and phase of the second type of nucleus depend on the energy transfer from the originally excited first type of nucleus and the state of the first type of nucleus again depends on the evolution time, the second plot axis represents effectively the chemical shifts owing to the different first types of nuclei in a particular molecule and their spatial arrangement with respect to the second type of nucleus. The measured peaks of the plot correspond to correlations between selected nuclei of the first and second type of nucleus within a given molecule. An advantage of the heteronuclear correlation consists in that it spreads the proton resonances over the much larger area of the chemical shift of the $^{13}C$. For this reason, this technique can provide well resolved information about the chemical shift of the protons of a sample although it may not be possible to resolve said chemical shifts of the protons by means of other one-dimensional spectroscopy techniques.

It is e.g. common practice in a typical two-dimensional heteronuclear correlation experiment, which is applied to an organic material, to investigate the correlation between hydrogen nuclei (protons) $^1H$ and $^{13}C$ nuclei within the sample. To achieve this, an RF pulse is applied during the preparation interval which excites the protons. In theory, the proton spins would carry out a free precession movement during the evolution interval. During the mixing interval, the protons interact with the $^{13}C$ nuclei via direct heteronuclear dipole-dipole coupling. Finally, the $^{13}C$ frequencies are measured during the detection interval. One of the advantages of such an experiment is that the heteronuclear coupling between the protons and the $^{13}C$ nuclei depends exclusively on the distance between the nuclei irrespective of the chemical bond. For this reason, the correlation offers the possibility to examine the stereochemistry of individual molecules and also the relative arrangement of neighbouring molecules.

The problem of this technique consists in that other couplings, like e.g. a "homonuclear" dipole-dipole coupling between protons and the "heteronuclear" dipole-dipole coupling between protons and hydrogen nuclei can cover the desired measured result if interactions during the evolution interval are permitted since they influence the measurement of chemical shifts in the proton spectrum. These last two interactions widen the peaks of the chemical shift in protons which leads to overlapping and thus prevent the assigment to the different locations. For this reason, it is necessary to suppress these two very strong interactions during the evolution interval. If a more frequent element than $^{13}C$ is examined, e.g. phosphor or aluminium, it may also be necessary under certain circumstances to suppress the homonuclear interaction between these nuclei.

In general, thoroughly prepared RF pulse sequences have to be applied in order to guarantee suppression of the homonuclear and heteronuclear couplings during the evolution interval, wherein the pulses irradiate either the protons, the $^{13}C$ nuclei or both simultaneously. The object of these pulse sequences consists in the suppression or averaging of the results of the undesired interactions. Many pulse sequences of this type are known in the art.

According to the prior art e.g. pulse sequences are known which suppress the homonuclear interactions between the protons in a relatively effective manner. Furthermore, other pulse sequences are known for the suppression of heteronuclear interactions between protons and $^{13}C$ nuclei. In experiments for the simultaneous suppression of both the homonuclear and the heteronuclear interactions, merely the known RF pulse sequences were combined. Since, however, the known pulse sequences were not prepared with respect to a combination, very long sequences of RF pulses resulted which were necessary for suppressing both interaction types and the methods did not lead to satisfactory results. For this reason, the number of non-equivalent proton locations which could be resolved, was considerably limited. This again limited the number of connections which could be successfully examined.

The initially mentioned document EP-A 0 481 256 describes an improved method that suppresses the heteronuclear interactions more effectively. The pulse sequence proposed therein is constructed in such a manner that it can be used in connection with one of the previously known pulse sequences such that both homonuclear and heteronuclear interactions are suppressed. Moreover, the suggested pulse sequence suppresses effectively homonuclear interactions, for which reason it can be used in connection with a multitude of types of nuclei. In detail, the first type of nucleus is excited during the preparation interval by a preparation pulse and is irradiated during the evolution interval with a so-called BLEW-12 sequence (phases X Y-X-X-Y-X X Y X X-Y-X) for the homonuclear decoupling of the nuclei of the first type (i.a. protons), whereas for decoupling of the two types of nuclei (i.a. $^1H$-$^{13}C$) and the nuclei of the second type of nucleus (i.a. $^{13}C$—$^{13}C$), the second type of nucleus is irradiated with a pulse sequence of 12 90°-RF pulses of a predetermined phase sequence, the so-called BB-12 sequence (-X Y-X X Y-X-X Y X-X Y-X). Since in this manner both the homonuclear and the heteronuclear interactions are decoupled, the protons can develop freely only under the influence of their chemical shift leading to improved resolution. After the evolution interval, two separated pulses (θ and Φ pulses) are irradiated on the protons to tilt the magnetization formed during the evolution interval into the plane perpendicular to the magnetic field for later observation. The θ pulse is a 90° pulse and the Φ pulse has an angle of 63° (with -Y-phase). These two pulses are followed by the so-called WIM-24 ("Windowless Isotropic Mixing) sequence which transmits nuclear polarization selectively from the protons to directly coupled carbon nuclei via the direct heteronuclear dipole interaction. The WIM-24 sequence suppresses additionally the chemical shifts of the protons and $^{13}C$ nuclei and also the proton-proton and $^{13}C-^{13}C$ homonuclear couplings, leaves, however, the proton-$^{13}C$ heteronuclear coupling. The WIM-24 sequence consists of a 24 pulse sequence irradiated on the protons and a corresponding 24 pulse sequence which is simultaneously irradiated on the $^{13}C$ nuclei. The sequence is prior art and is described in detail in the article "Heteronuclear Correlation Spectroscopy in Rotating Solids" by P. Caravatti, L. Braunschweiler and R. R. Ernst in Chem. Phys. Letters 100, No. 4, pp 305–310 (1983).

Finally, a continuous wave signal (CW) of a relatively high intensity is transmitted at the proton frequency during the detection interval in order to decouple the protons from the $^{13}C$ nuclei in a known manner, and the $^{13}C$-FID is measured.

During the entire experiment, the solid sample is rotated in a standard manner about the "magic angle" in order to reduce broadening due to the anisotropy of the chemical shift.

In the initially mentioned document EP-A 0 481 256 (U.S. Pat. No. 5,117,186) it is also referred to the fact that instead of the WIM-24 sequence also other pulse sequences known in the art may be used in order to effect the selective cross polarization during the mixing interval and at the same time still suppress the homonuclear dipole interaction. The WIM-24 sequence was indeed preferred, but a phase- and frequency-switched Lee-Goldburg sequence (FSLG) in connection with a phase-switched $^{13}C$ sequence could cause a similarly effective selective cross polarization during the mixing interval. This mixing method is described in detail in the article "Frequency-Switched Pulse Sequences: Homonuclear Decoupling and Dilute Spin NMR in Solids" by A. Bielecki, A. C. Kolbert and M. H. Levitt in Chem. Phys. Letters 155, Nos. 4,5 pp.341 (1989)

The method known from EP-A 0 481 256 (U.S. Pat. No. 5,117,186) has, however, the disadvantage, that the BLEW-12-sequence used during the evolution interval is relatively long. It is i.a. limited to about 36 microseconds to avoid RF breakthrough in the probe. This again limits the possible spin rates of the sample rotation about the magic angle since the duration of a revolution must be large compared to the time period of the BLEW-12 sequence. In practice, the spin rates are thereby limited to less than 5 kHz whereas current probes permit spin rates of over 15 kHz.

The article J.Magn.Res. A 120, p. 274–277 (1996) describes a method in which indications of resolving the chemical shift are given with a pulse sequence with high fields even without additional narrowing of the proton spectrum.

The article J.Magn.Res. A 121, p. 114–120 (1996) describes a method of imaging NMR in which the line-narrowing effect of the FSLG sequence is utilized in order to achieve slice selection.

Thus there is the need for a method of the initially mentioned kind which permits higher spin rates of the sample rotation about the magic angle.

SUMMARY OF THE INVENTION

The object is achieved in that the at least one preparation radio frequency pulse has a broad band width with a central frequency in the middle of the nuclear magnetic resonance spectrum of the first type of nucleus of the sample and effects rotation of the nuclear magnetization of the first type of nucleus about an axis perpendicular to the direction of the magnetic field (X) having an angle of, preferably other than 90°, in particular approximately 109° or approximately 145°, and that the evolution radio frequency pulses form a so-called FSLG partial sequence with two consecutive broad-band evolution radio frequency pulses which are phase shifted (X, -X) with respect to each other by 180°, the central frequencies of which are shifted with respect to the one of the preparation radio frequency pulse in opposite directions and which cause, in each case, rotation of the nuclear magnetization of the first type of nucleus by approximately 294°.

The object is herewith completely achieved.

The use of the phase-shifted and frequency-shifted Lee-Goldburg sequence (FSLG), which is known per se from another connection, in the evolution interval reduces considerably the corresponding cycle time. A typical value is approximately 10 microseconds for the basic FSLG sequence, wherein even shorter times are easily imaginable. In this manner, however, the maximum spin rate of the current probe heads can be used to its full extent. 15 kHz do not present a problem.

As a consequence, the method can be applied without any problems in magnets with higher field strength, without interfering spinning side bands.

In this manner, a higher spectral dispersion is achieved which increases the resolution especially in the F1 dimension (first type of nucleus).

Higher spin rates decouple the first and second types of nuclei (called i.a. I- and S-spins, mainly but not exclusively protons and $^{13}C$) from one another as well as those of the same type in a relatively effective manner such that not too much is expected from the efficiency of the decoupling sequence in the evolution interval (in the present case FSLG). In this way, the experiment becomes less sensitive to misadjustments.

Selection of direct couplings can occur in this case already by normal cross polarization after a short contact period, i.e. the mixing interval does not have to be designed as a WIM-24 or FSLG. This can facilitate the method to a considerable degree.

In the initially mentioned method, a BLEW-12 and a BB-12 sequence had to be performed simultaneously in the evolution interval in order to decouple the two types of spins. This is no longer necessary with the method according to the invention since this is already achieved by means of the high spin rate. The latter also decouples the spins of the second type of nucleus from one another such that samples can also be measured in which these spins are highly concentrated, i.e. they are no longer "rare" spins. This is a significant advantage since in samples with inherent low sensitiveness (biological samples, thinned samples) it is possible to work only with a high concentration of e.g. $^{13}C$.

Since simultaneous decoupling is no longer necessary, the further advantage shows that higher decoupling fields can be used since now only one RF field is applied, and since RF breakthrough with simultaneous application of several RF fields is more likely since the voltages add up.

Experiments have also shown that the efficiency of the FSLG sequence used, according to the invention, in the evolution interval, is superior to any other sequence (BLEW-12 or BR-24) when decoupling the spins of the first type of nucleus ("frequent" spins, mainly protons or $^{19}F$), such that th e resolution of the chemical shift of these spins is considerably better. In practice, a resolution is obtained which cannot be achieved even in a well adjusted BR-24 experiment for observing the "frequent" spins (for this purpose, BR-24 is considered to be the best sequence up to now).

By means of simple variation of the contact time, correlation of merely strongly coupled spins (short contact time) and strongly and weakly coupled spins (long contact time) can be adjusted. Two-dimensional spectra with total correlation of all spins are imagineable.

The modification of the method of directly measuring dipolar couplings between frequent and rare spins and also of so-called "Spectral Editing" (selective measurement of rare spins with different "protonizing degree" similar to the DEPT sequence) in solutions becomes possible in this connection.

The method can be easily integrated in a 3D method.

During the evolution interval, preferably no radio frequency pulses are irradiated in the frequency band of the second type of nucleus. As mentioned above, this is no longer necessary for the decoupling, and dielectric breakdowns in the probe head are safely avoided.

Preferably, the first type of nucleus is $^1H$ and the second type of nucleus is $^{13}C$. These are for many materials, mainly in the organic area, the most interesting "frequent" and "rare" nuclei.

In a preferred embodiment, the pulse sequence is executed n times, preferentially 512 times whereby in the pth evolution interval ($1 \leq p \leq n$), the two evolution radio frequency pulses are applied (p-1) times in succession. In this manner, successive incrementation of the irradiation interval is carried out.

A radio frequency pulse is irradiated preferably during the mixing interval in the frequency band of the first type of nucleus, which turns the nuclear magnetization of the first type of nucleus by approximately 54° about an axis perpendicular to the magnetic field, followed by a VACP spin lock pulse (Variable Amplitude Cross Polarisation) phase shifted thereto by 90°, the amplitude of which decreases linearly from a maximum value to half the maximum value. This is a very advantageous mixing method, but not the only one possible. It is described e.g. by O. B. Peersen, X. Wu, I. Kustanovich and S. O. Smith in J. Magn.Res. A 104 (1993) 334. Alternatively, the 54° pulse can be replaced by an antiphased (−X) 63° pulse followed by a 90° pulse (+X).

In a preferred method, a TPPM sequence (Two Pulse Phase Modulated) is used during the detection interval by means of which the nuclear spins of the first type of nucleus are decoupled. This decoupling is described in the article by A. E. Bennett, C. M. Rienstra, M. Auger, K. V. Lakshmi and R. G. Griffin in J. Chem. Phys. 103 (1995) 6951 pp.

It is furthermore preferred that a waiting interval is introduced between the pth detection interval and the (p+1) th preparation interval which is longer than the relaxation times $T_1$ of the two spin types. Thereby, otherwise disturbing residual magnetizations have decayed largely before the following sequence.

For further elimination of phase errors, it is advantageous that the phase of the excitation radio frequency pulse of the second type of nucleus is varied in the mixing interval according to a CYCLOPS sequence. The Cyclops sequence is described e.g. in the book "A Handbook of Nuclear Magnetic Resonance" by Ray Freeman, Longman Scientific & Technical (1990), p. 151–156.

The method according to the invention is particularly advantageous in rotational frequencies of the sample about the magic angle which are larger than 10 kHz.

The above-mentioned advantages of the method according to the invention become particularly evident if the duration of the two evolution radio frequency pulses is shorter than 15 microseconds, in each case.

It is further preferred that the frequency shift of the central frequencies of the two evolution radio frequency pulses is symmetrical to the one of the preparation pulse between ±40 kHz and ±100 kHz. With this, experiments gave the best results, in particular if the frequency shift of the central frequencies of the two evolution radio frequency pulses is carried out in a phase-continuous manner.

The easiness of the sequences, their insensitivity to misadjustments and the improved resolution offer to use the method as part of a three-dimensional spectroscopy method.

The method can be used in an advantageous manner for editing nuclear magnetic resonance spectra (Spectral Editing). Spectral editing is extensively described in the book "A Handbook of Nuclear Magnetic Resonance" by Ray Freeman, Longman Scientific & Technical (1990), p. 137–141 and also in the article by D. Burum and A. Bielecki, J.Magn.Res. 95, p. 184pp (1991).

Further details of the invention are made known by the following drawings and can be derived therefore. It is obvious that these drawings can be used either individually or in any combination without leaving the scope of the present invention.

DESCRIPTION OF THE PREFERRED EMBODIMENT

Figure 1:
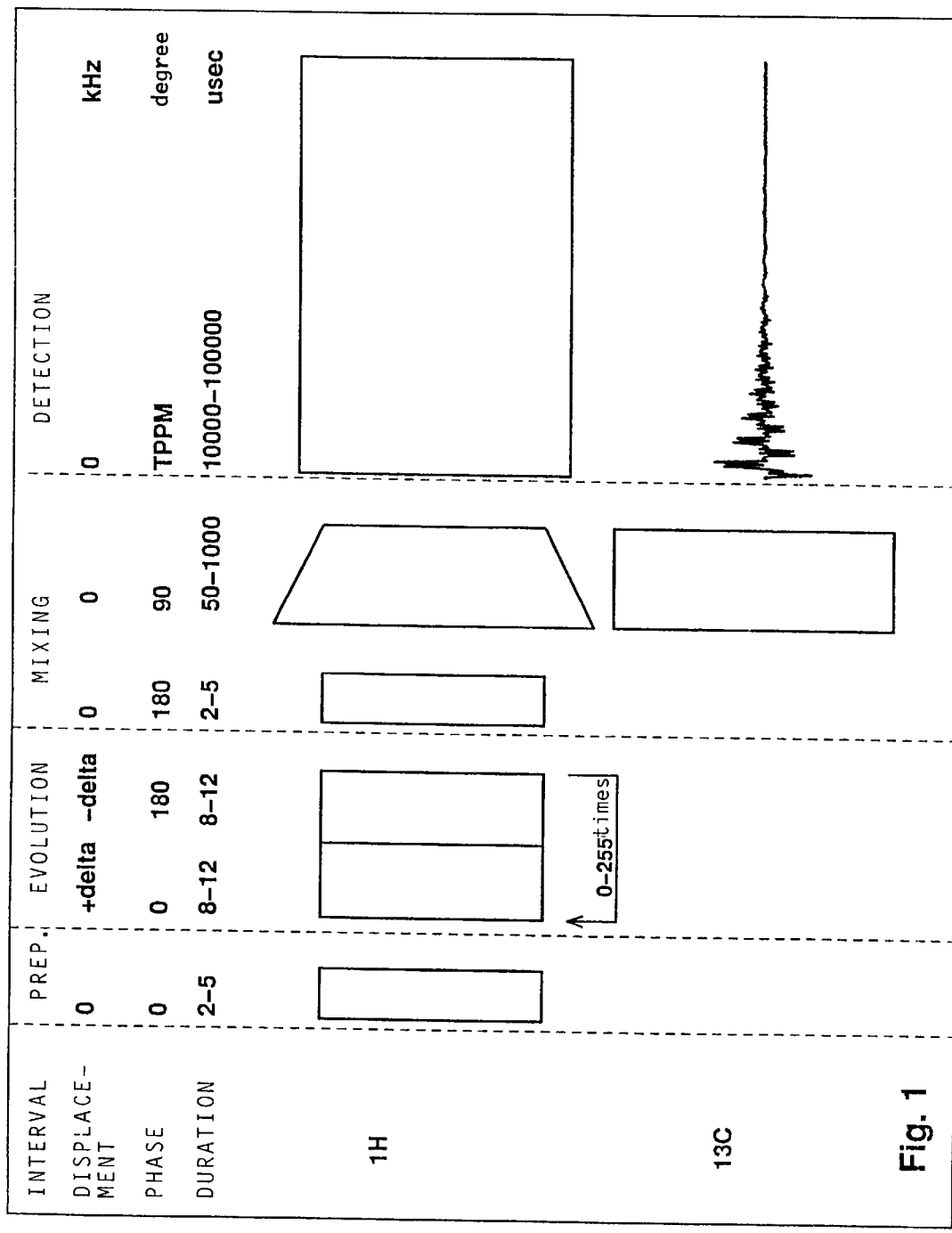
FIG. 1 shows a time diagram of a preferred sequence of the method according to the invention.

FIG. 1 shows on a horizontal time axis the four successive time intervals (also called "periods") of a sequence of a preferred embodiment of the method according to the invention. The sequence shown is repeated n times in the method (256 times in the example), wherein the preparation interval, the mixing interval and the detection interval remain unchanged in each case, however, the content of the evolution interval is incremented; i.e. in the first sequence, the interval is not present, then it has the content shown in FIG. 1 and in the following sequences the content is added again in each case such that in the 256th sequence, the two evolution pulses are irradiated directly after one another 255 times.

The preparation pulse is a so-called "Double Magic Angle X-Pulse" with the unshifted proton frequency and relative phase 0° and lasts typically 2 to 5 microseconds. It has a broad band width with a central frequency in the middle of the proton spectrum. It is polarized in such a manner that it effects rotation of the proton spins from the direction of the static magnetic field (z direction) about an axis perpendicular thereto (x). Its intensity and duration are designed such that the rotational angle is 109°, in a modified version 145°, however, is clearly different from 90°. In the preparation interval no RF pulse has an effect on the $^{13}$C nuclei.

During the first sequence of the experiment, the subsequent evolution interval is missing completely, i.e. the mixing interval follows immediately. In the following sequences, an RF double pulse is newly introduced into the evolution interval, in each case, as shown in FIG. 1; i.e. the double pulse is present once in the second sequence and twice in the third sequence etc. In the 256th sequence it occurs 255 times, wherein the pulses in the interval follow each other directly in terms of time, in each case. The double pulses incremented in this manner form a so-called FSLG partial sequence (Frequency Shifted Lee-Goldburg). The two pulses are shifted, with respect to the proton central frequency, symmetrically to higher and lower frequencies by delta, in each case. Delta is between 40 and 100 kHz. The pulses have a broad band width and are 8 to 12 microseconds long in each case. The phase of the first pulse is 0° (X), the phase of the second is 180° (-X). Their intensity and duration is designed such that they effect rotation of the proton magnetization by approximately 294° in each case. In the evolution interval, no RF pulse is irradiated on the $^{13}$C nuclei.

During the mixing interval, a broad-band high frequency pulse of a duration of 2 to 5 microseconds is irradiated in the proton frequency band which turns the proton magnetization by approximately 54°) about an axis (-X) perpendicular to the magnetic field, followed by a VACP spin lock pulse which is phase-shifted thereto by 90° and the amplitude of which decreases in a linear manner from a maximum value to half the maximum value. The duration of the spin lock pulse is between 50 and 1000 microseconds. During the spin lock pulse, a contact RF pulse acts on the $^{13}$C nuclei, the amplitude of which is selected such that the Hartmann-Hahn condition is met. The phase of the contact pulse may be permuted according to the CYCLOPS method.

During the detection interval, a TPPM sequence (Two Pulse Phase Modulated) is used for the decoupling of the protons and the $^{13}$C signal is detected. The actual detection interval lasts between 10000 and 100000 microseconds. Between the pth detection interval and the (p+1)th preparation interval, however, an essentially longer waiting interval is introduced which is longer than the relaxation time $T_1$ of the frequent spins. In this manner, otherwise disturbing residual magnetizations have died off largely before the subsequent sequence.

As mentioned before, the pulse sequence for gaining 2D spectra starts with the "Double Magic Angle X-Pulse" on the protons, directly followed by the Lee-Goldburg-Pulse in the YZ plane. Apart from a phase shift of 45°, the cone spanned by the precessing spins is the same as the one subtended by rotation of the X axis of the rotating coordinate system about the (1,1,1) direction. After the evolution interval, the proton magnetization is turned back again by one single pulse with the magic angle (Magic Angle Pulse), wherein all components are guided perpendicularly to the Lee-Goldburg-Pulse back to the XY plane and the component which is "spin-locked" along the LG pulse is guided back to the Z axis.

Figure 2:
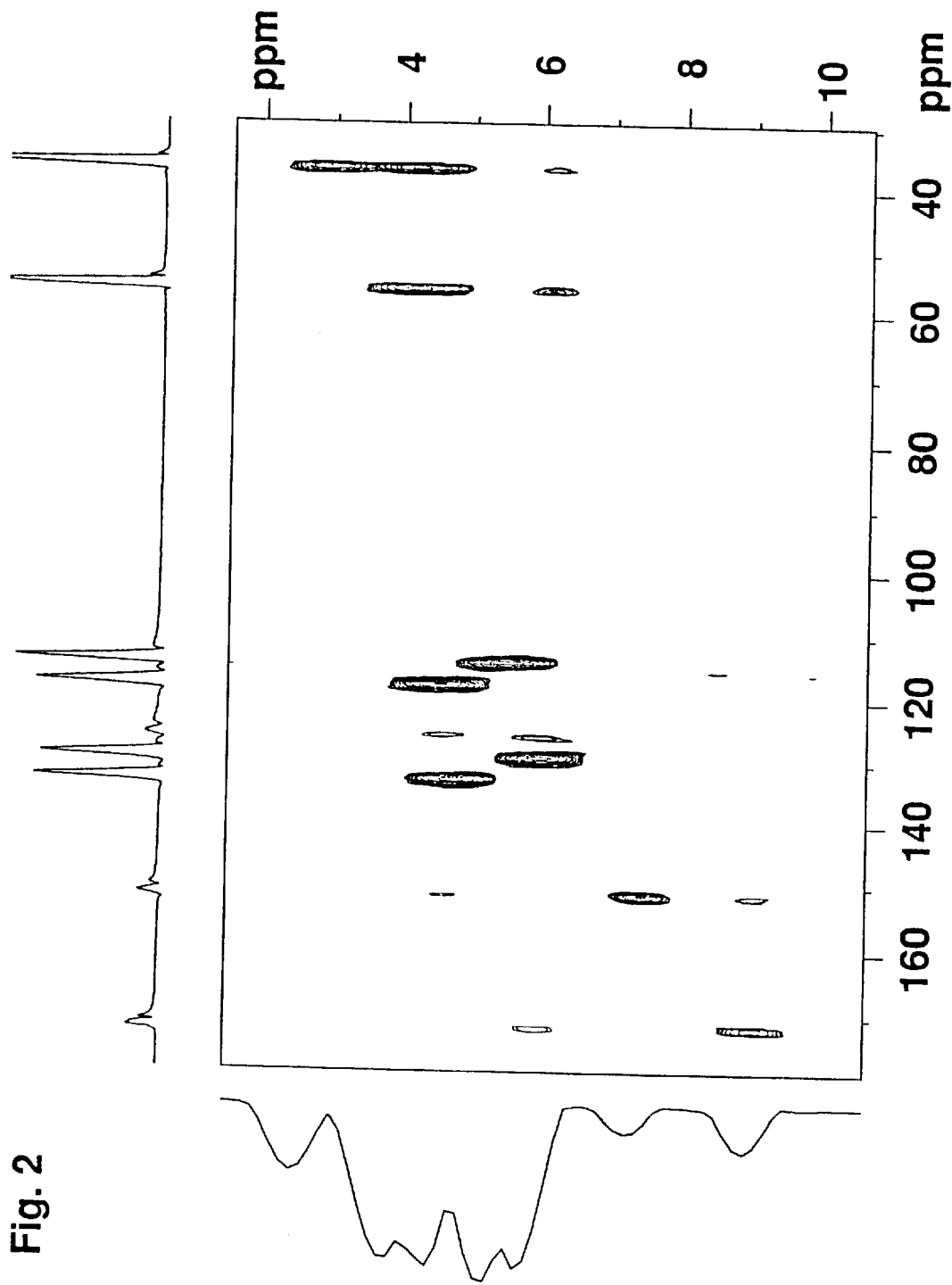
FIG. 2 shows a 2D heteronuclear ($^1H$-$^{13}C$) FSLG decoupled correlation spectrum recorded on [U-$^{13}C$]L-tyrosine at a spin rate of 13.0 kHz.

The two-dimensional dipolar correlation solid state NMR spectrum shown below with cross polarization and rotation about the magic angle (CPMAS) and also FSLG decoupled was obtained with a solid state NMR spectrometer DMX-400 using a 4 mm double resonance probe manufactured by Bruker Analytik GmbH. The probe volume was limited to the centre of the rotor in order to improve the RF homogeneity. Since with high rotational frequencies maintaining the Hartmann-Hahn-condition and the corresponding efficiency of the CP magnetization transfer is highly sensitive to RF performance instabilities, a CP sequence with ramp-shaped amplitude (Ramp-CP) was used in order to achieve a broader adjustment profile. During data acquisition of the $^{13}$C signal, the protons are decoupled from the carbon spins by a TPPM scheme which considerably increases the $^{13}$C resolution in a high field. The phases of the entire FSLG sequence and of the two pulses with magic angle are varied according to a TPPI scheme for simulating a phase-sensitive detection (see D. Marion and K. Wuthrich, Biochem.Biophys.Res.Com. 113 (1983)967pp.). In FIG. 2, before the actual 2D experiment, the duration of the successive FSLG pulse was optimized with an adamantane sample to 11.4 microseconds. The CP contact time was to be kept short in order to avoid further transfer of the homonuclear coherence transfer processes during cross polarization both with protons and with similar carbon spins. Typical mixing times for the cross polarization are 50 to 200 microseconds. The phase modulation angle for the TPPM decoupling was set to 15° and the flip pulse length was optimized to 6.8 $\mu$s in order to achieve an optimum $^{13}$C resolution. A typical proton pulse length for 90° was approximately 2.8 $\mu$s. The frequency shift delta in the evolution interval was ±67 kHz. Owing to the mixing time of 100 $\mu$s used, direct couplings are indicated as intensive and remote couplings as weak correlations.

The method was applied in the example of FIG. 2 to a sample of [U-$^{13}$C]L-tyrosine-hydrochloride with a rotational frequency of 13.0 kHz. The resulting 2D spectrum is shown in FIG. 2. The proton-carbon-correlations are well resolved, also in the aliphatic area of the spectrum. Owing to the high rotational speed, the overall improvement of the resolution can be achieved much easier than with multi-pulse-decoupling. The allocation of the signals is shown in the projections and coincides with prior results (B. J. van Rossum, G. J. Boender and H. J. M. de Groot, J.Magn.Reson. A 120 (1996) 274pp.). The proton lines are resolved partially also in the F1 projection which emphasizes the generally good efficiency of the FSLG decoupling in the evolution interval. The strongest correlations in FIG. 2 are between carbons and directly bonded protons. Intramolecular and also intermolecular correlations with remote protons occur. Particularly emphasized is the cross peak between the carboxyl-hydrogen-binding proton (referenced to about 9 ppm in this plot) and the 4'-$^{13}$C at about 152 ppm due to the transfer through an intermolecular hydrogen bond. This shows that heteronuclear dipolar correlation spectroscopy using FSLG homonuclear decoupling provides superior results at high rotational frequencies and in high magnetic fields. The improvements in resolution open promising applications for the development of assignment strategies with uniformly enriched biological samples.

Figure 3:
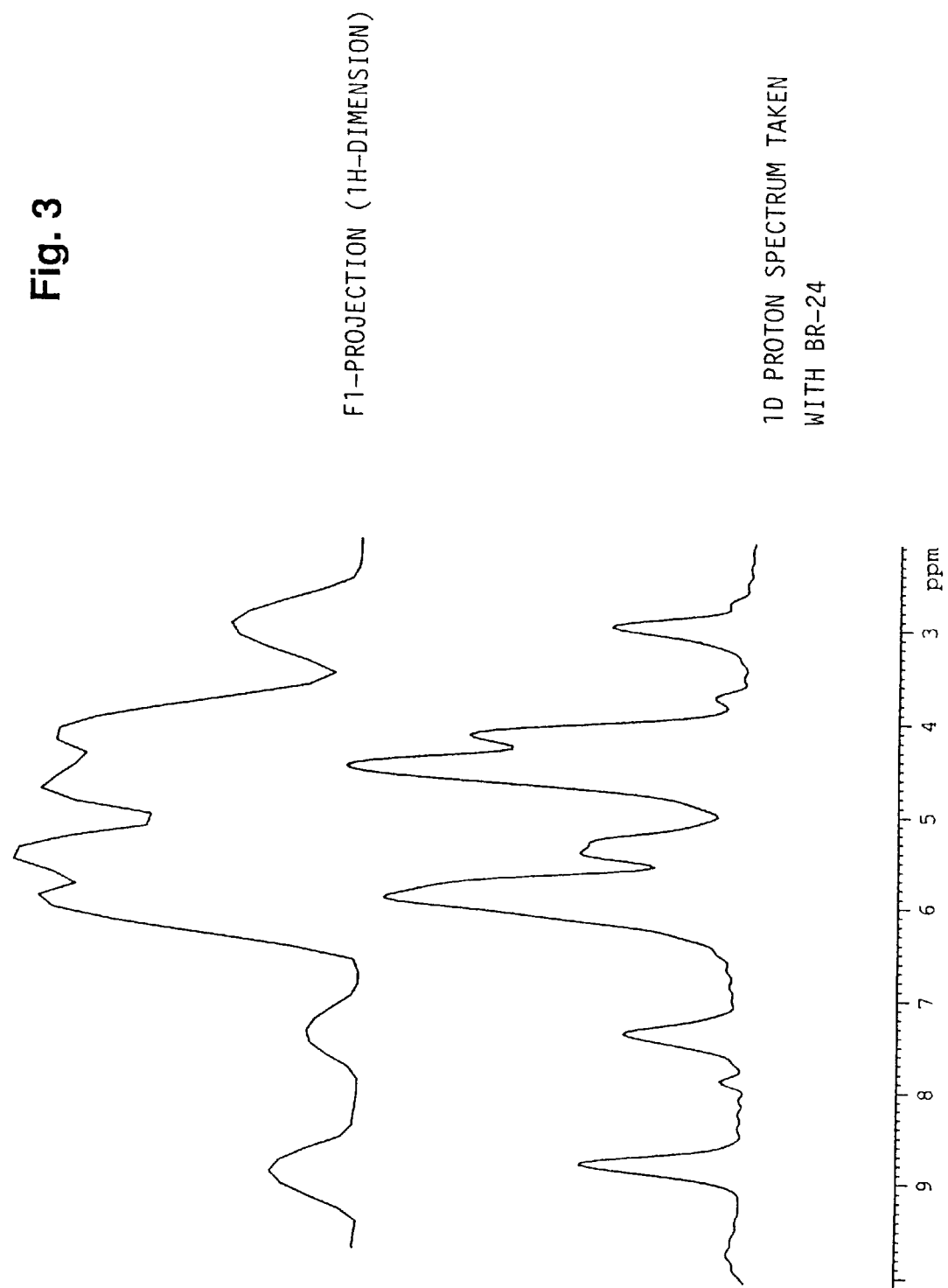
FIG. 3 shows a projection of the two-dimensional spectrum of FIG. 2, recorded according to FIG. 1, onto the proton frequency axis (F1) at 2.8 μs standardized pulse length (90°) and 13 kHz rotational frequency (upper line) compared with a one-dimensional proton spectrum with the BR-24 sequence (second line) at 1.7 μs standardized pulse length (90°) and 2 kHz rotational frequency.

In FIG. 3, the F1 projection of the two-dimensional spectrum of FIG. 2 is compared with a 1D proton spectrum, recorded with BR-24 (the best known sequence) at considerably higher pulse power and at only 2 kHz rotational frequency. At a rotational frequency of 13 kHz, resolution in the one-dimensional spectrum would no longer be achieved. This proves that the method according to the invention is capable of providing proton lines of good resolution on the F1 axis at high spinning frequencies.

We claim:

1. A method of two-dimensional, heteronuclear correlation spectroscopy in a nuclear magnetic resonance spectrometer for the investigation of a solid sample containing a first type of nucleus and a second type of nucleus using a nuclear magnetic resonance pulse sequence having a preparation interval, an evolution interval, a mixing interval and a detection interval, the method comprising the steps of:

a) rotating the sample at a rotational frequency in excess of 1 kHz about a rotation axis tilted by approximately 54° with respect to an axis of a homogeneous magnetic field;

b) executing the preparation interval in which the first type of nucleus is excited by a broad band width preparation radio frequency pulse in a first frequency band having a central frequency in a middle of a nuclear magnetic resonance spectrum of the first type of nucleus to rotate a nuclear magnetization of the first type of nucleus through an angle about an X axis perpendicular to a direction of said magnetic field;

c) executing the evolution interval in which the first type of nucleus is exposed to a first broad-band FSLG pulse in said first frequency band having a central frequency shifted in a first frequency direction by a first amount from said central frequency of said preparation radio frequency pulse, said first FSLG pulse rotating said nuclear magnetization of the first type of nucleus by approximately 294°, said first FSLG pulse consecutively followed by a second broad-band FSLG pulse in said first frequency band having a central frequency shifted by a second amount from said central frequency of said preparation radio frequency pulse in a second frequency direction, said second FSLG pulse rotating said nuclear magnetization of the first type of nucleus by approximately 294°, said second frequency direction opposite to said first frequency direction, said first and second FSLG pulses being phase-shifted with respect to each other by 180°;

d) executing the mixing interval in which the first type of nucleus is irradiated with CP radio frequency pulses in the first frequency band to transmit said nuclear magnetization of the first type of nucleus to the second type of nucleus and in which the second type of nucleus is irradiated with a second excitation radio frequency a pulse in a second frequency band;

e) executing the detection interval in which the first type of nucleus is exposed to a decoupling radio frequency pulse in the first frequency band and in which a free induction decay of the second type of nucleus is detected in the second frequency band; and f) successively repeating steps a) through e) n times with identical preparation, mixing and detection intervals, but with changed evolution interval, wherein no radio frequency pulses are irradiated in said second frequency band durinq step c).

2. The method of claim 1, wherein said angle of step b) is not equal to 90°.

3. The method of claim 2, wherein said angle is one of approximately 109° and approximately 145°.

4. The method of claim 1, wherein the first type of nucleus is $^1$H and the second type of nucleus is $^{13}$C.

5. The method of claim 1, wherein, in a pth repetition of step c) ($1 \leq p \leq n$), said first and said second FSLG pulses are irradiated p-1 times after one another.

6. The method of claim 1, wherein during step d), the first type of nucleus is irradiated with a first mixing pulse to rotate said nuclear magnetization of the first type of nucleus by approximately 54° about an axis perpendicular to said magnetic field, followed by a VACP spin lock pulse phase-shifted by 90° with respect to said first mixing pulse, said VACP pulse having an amplitude which decreases linearly from a maximum value to half said maximum value.

7. The method of claim 1, wherein during step e), said decoupling pulse is a TPPM sequence.

8. The method of claim 1, further comprising a waiting interval inserted between a pth repetition ($1 \leq p \leq n$) of step e) and a (p+1)th repetition of step b), said waiting interval being longer than a relaxation time $T_1$ of the first type of nucleus.

9. The method of claim 1, wherein, in step d), a phase of said second excitation radio frequency pulse is varied according to a CYCLOPS sequence.

10. The method of claim 1, wherein said rotational frequency is larger than 10 kHz.

11. The method of claim 1, wherein said first and said second FSLG pulses each have a duration of less than 15 microseconds.

12. The method of claim 1, wherein, in step c), said first amount is largely equal to said second amount, said first and second amounts lying between 40 kHz and 100 kHz.

13. The method of claim 1, wherein said first and second FSLG pulses are frequency-shifted in a phase-continuous manner.

14. The method of claim 1, further comprising the step of three-dimensional spectroscopy.

15. The method of claim 1, further comprising the step of determining dipolar couplings.

16. The method of claim 1, further comprising the step of spectral editing nuclear magnetic resonance spectra.

* * * * *